(12) United States Patent
Kim

(10) Patent No.: US 7,034,612 B2
(45) Date of Patent: Apr. 25, 2006

(54) APPARATUS AND METHOD FOR COMPENSATING PRE-DISTORTION OF A POWER AMPLIFIER

(75) Inventor: Wang-Rae Kim, Seoul (KR)

(73) Assignee: LG Electronics Inc., Seoul (KR)

(*) Notice: Subject to any disclaimer, the term of this patent is extended or adjusted under 35 U.S.C. 154(b) by 0 days.

(21) Appl. No.: 10/621,470

(22) Filed: Jul. 18, 2003

(65) Prior Publication Data

US 2004/0017257 A1    Jan. 29, 2004

(30) Foreign Application Priority Data

Jul. 20, 2002  (KR) ...................... 10-2002-0042789
Dec. 18, 2002  (KR) ...................... 10-2002-0081455

(51) Int. Cl.
*H03F 1/26* (2006.01)

(52) U.S. Cl. ............ 330/149; 327/549; 327/551; 327/552; 327/560

(58) Field of Classification Search ............ 330/2, 330/149; 375/297, 296; 327/551, 552, 560, 327/549

See application file for complete search history.

(56) References Cited

U.S. PATENT DOCUMENTS

2002/0044014 A1 * 4/2002 Wright et al. ................. 330/2

FOREIGN PATENT DOCUMENTS

JP    2001-094617    4/2001
JP    2001-141754    5/2002

OTHER PUBLICATIONS

CN Office Action dated May 13, 2005.

* cited by examiner

*Primary Examiner*—Michael B. Shingleton
(74) *Attorney, Agent, or Firm*—Fleshner & Kim, LLP

(57) ABSTRACT

An apparatus and method that compensates for pre-distortion of a power amplifier includes a digital pre-distorter controller which generates a power/phase compensation coefficient, a temperature compensation coefficient and a frequency compensation coefficient, a look-up table which stores the coefficients, a pre-distorter kernel which pre-compensates an input signal based on the temperature compensation coefficient from the look-up table, and a correction filter which compensates an output signal of the kernel based on the frequency compensation coefficient from the look-up table. If desired, an input signal may be pre-distorted based on only one of the temperature and frequency compensation coefficients along with the power/phase compensation coefficient. Nonlinear characteristics of the power amplifier are accurately checked and distortion due to the nonlinear characteristics are compensated for.

19 Claims, 14 Drawing Sheets

APPARATUS AND METHOD FOR COMPENSATING PRE-DISTORTION OF A POWER AMPLIFIER

BACKGROUND OF THE INVENTION

1. Field of the Invention

The present invention relates to amplifier circuits, and more particularly to an apparatus and method which compensates for distortion in a power amplifier.

2. Background of the Related Art

Compared to an analog mobile communication system, a digital mobile communication system has a wider signal bandwidth which allows it to transmit more signals at a higher rate. In such a system, the signal is converted into a radio frequency (RF) signal and transmitted a certain distance. An RF power amplifier is used at a final transmission stage of the mobile communication system to enable the transmission.

In an RF power amplifier, linearity is a factor in amplifying every input signal at the same amplification rate for output. Unfortunately, most power amplifiers do not have a wide linearization range, so that a signal amplified at a region beyond the linearization range is inevitably distorted and outputted.

Methods for improving the distortion characteristics of power amplifiers have therefore been developed. These methods include a feed forward method, an envelope feedback method, and a pre-distortion method. Among these, the pre-distortion method is widely used because of its low cost for relatively high performance and operation within a wider bandwidth.

FIG. 1 shows an apparatus which compensates for pre-distortion in a power amplifier according to the related art. This apparatus includes a digital pre-distorter (DPD) 10 for pre-distorting a baseband digital signal (Vref) based on a specific compensation coefficient (Vcoef); a digital-to-analog converter (DAC) 20 for converting the digital signal (Vd) output from digital pre-distorter 10 into an analog signal (Vda); and an up-converter 30 for up-converting the baseband signal (Vda) outputted from the digital/analog converter 20 into a radio frequency signal (Vdf). The apparatus also includes a power amplifier (PA) 40 for amplifying the analog radio frequency signal (Vdf) outputted from the up-converter 30 and supplying the amplified signal to a directional coupler 50. Additionally, a down-converter 60 down-converts the analog radio frequency signal (Vfbrf) fed back after being branched from the directional coupler 50 into a baseband signal (VFBA). An analog-to-digital converter (ADC) 70 converts the analog signal (Vfba) outputted from the down-converter 60 into a digital signal (Vfb). And, a digital pre-distorter controller (DPDC) 80 compares the signal (Vfb) outputted from the analog-to-digital converter 70 and the baseband digital input signal (Vref) and generates a compensation coefficient (Vcoef) to compensate for the nonlinear characteristics of the power amplifier 40. The directional coupler 50 detects a portion (Vmrf) of the analog radio frequency signal outputted from the power amplifier 40 and transmits the remaining portion of the signal to the down-converter 60.

FIG. 2 shows digital pre-distorter 10 in accordance with the related art. The digital pre-distorter includes an instantaneous power measuring unit 11 for detecting a power level of the input digital signal (Vref), a look-up table 12 for storing a plurality of coefficient (Vcoef) applied from the digital pre-distorter controller 80 and outputting a compensation coefficient selected by a power level applied from the instantaneous power measuring unit 11, and a pre-distorter kernel 13 for pre-distorting the input digital signal (Vref) with the compensation coefficient transmitted from the look-up table 12. The resulting signal $V_d$ is then sent to digital/analog converter 20.

FIG. 3 shows a method which compensates for pre-distortion of the power amplifier in accordance with the related art. Operation of the apparatus for compensating pre-distortion of a power amplifier shown in FIG. 1 may be described with reference to this method.

The apparatus for compensating pre-distortion of a power amplifier in accordance with the related art has roughly two operations modes: an initial mode for measuring nonlinear characteristics of power amplifier; and a normal mode for compensating an input signal with a compensation coefficient detected in the initial mode and outputting the compensated signal.

In the initial mode, a baseband digital signal is inputted as a training signal to the pre-distortion compensating apparatus (step S1). The training signal, which is used to detect nonlinear characteristics of the entire operation region of the power amplifier, is simultaneously applied to the digital pre-distorter 10 and the digital pre-distorter controller 80.

The digital pre-distorter 10 outputs an inputted digital signal as it is without pre-distorting it. The digital signal outputted from the digital pre-distorter 10 is converted into an analog baseband signal through the digital-to-analog converter 20, which is then applied to the up-converter 30 and up-converted into a radio frequency signal.

The analog radio frequency signal outputted from the up-converter 30 is amplified to a predetermined level in the power amplifier 40 and outputted therefrom (step S2). A portion of the output signal of the power amplifier 40 is detected by the directional coupler 50, and the remaining portion of the output signal is fed back to the down-converter 60. The signal inputted to the power amplifier 40 is distorted nonlinearly and outputted.

Upon receiving the analog radio frequency signal which has been branched at the directional coupler 50, the down-converter 60 down-converts it into a baseband signal and applies the baseband signal to the analog-to-digital converter 70. Then, the analog-to-digital converter 70 converts the received analog signal into a digital signal.

The digital pre-distorter controller 80 compares the digital signal outputted from the analog-to-digital converter 70 and the training signal which has been inputted to the digital pre-distorter 10 at the early stage (step S3), analyzes a distortion state of the signal according to the comparison result, generates a compensation coefficient, and applies the compensation coefficient (Vcoef) to the digital pre-distorter 10 (step S4).

The digital pre-distorter 10 classifies the compensation coefficient by power levels and stores it in the look-up table 12. In this case, the compensation coefficient is classified on the basis of an instantaneous power level of the digital signal inputted to the digital pre-distorter 10, and the power level serves as an address for outputting a compensation coefficient.

In this manner, the distortion state of the power amplifier 40 is checked in the initial mode. Then, when the compensation coefficient for linearizing the distortion state is completely stored in the look-up table of the digital pre-distorter 10, the apparatus for compensating pre-distortion of the power amplifier operates in the normal mode. In the normal mode, it is judged whether a signal inputted to the digital pre-distorter 10 is a normal signal (step S5).

If a normal signal is inputted to the digital pre-distorter 10 and to the digital pre-distorter controller 80, the instantaneous power measuring unit 11 of the digital pre-distorter 10 detects a power level of the input signal and applies it to the look-up table 12. Then, the look-up table 12 extracts a compensation coefficient by taking the power level as an address and applies the corresponding compensation coefficient to the pre-distorter kernel 13.

The pre-distorter kernel 13 pre-distorts the input signal and the compensation coefficient and outputs it to the digital-to-analog converter 20. An analog signal outputted from the digital-to-analog converter 20 is inputted to the power amplifier 40 after passing through the up-converter 30.

The analog signal inputted to the power amplifier 40 is a signal which has been compensated for the nonlinear characteristics of the power amplifier in the digital pre-distorter 10, so that the power amplifier 40 outputs a non-distorted, normal signal.

The output signal of the power amplifier 40 passes through the directional coupler 50, the down-converter 60 and the analog-to-digital converter 70 so as to be applied to the digital pre-distorter controller 80.

Then, the digital pre-distorter controller 80 analyzes again the fed back signal. If distortion occurs again newly, the digital pre-distorter controller 80 generates an updated compensation coefficient and records/stores it in the look-up table 12 of the digital pre-distorter 10 (step S7). The operation of obtaining a compensation coefficient and updating/storing it in the look-up table 12 while the pre-distortion compensating apparatus operates in the normal mode is called 'adaptation'.

If a normal signal is successively inputted to the apparatus for compensating pre-distortion of the power amplifier 40 (step S8), the process of pre-compensating and detecting the input signal and updating the compensation coefficient is continually performed, and if there is no input signal, the process is terminated (step S9).

FIGS. 4A, 4B, 5A and 5B are graphs showing nonlinear characteristics of a general power amplifier. In detail, FIGS. 4A and 4B show gain characteristics and phase characteristics according to a temperature change and FIGS. 5A and 5B show gain characteristics and phase characteristics according to a frequency change.

In general, the nonlinear characteristics of the power amplifier can be roughly divided into AM-AM and AM-PM characteristics. The AM-AM characteristics is that gain characteristics are nonlinearly changed according to a size of a signal inputted to the power amplifier. The AM-PM characteristics is that a phase of an output signal is changed according to a size of a signal inputted to the power amplifier.

The AM-AM characteristics and the AM-PM characteristics cause generation of a spectral re-growth, so that when a signal is inputted to the power amplifier, the signal is distorted and outputted and the entire performance of a transmission system is deteriorated.

Therefore, in order to remove such nonlinear characteristics of the power amplifier, a pre-distorter is used. The pre-distorter improves the entire performance of a transmitter by constantly maintaining a gain of the power amplifier according to the size of an input signal and adjusting a phase of an output signal that is not changed according to the size of an input signal.

However, as shown in FIGS. 4A, 4B, 5A, and 5B, the nonlinear characteristics are also changed by a temperature or a frequency. Also, failure to compensate for the memory effect caused by those factors would also degrade the performance of the pre-distorter. Thus, the related art apparatus for compensating pre-distortion of the power amplifier has at least the following problems.

Since an input signal is simply pre-compensated by using a compensation coefficient, without considering a temperature change or a frequency change of an input signal, the pre-distorter cannot accurately compensate for the memory effect according to the temperature change or the frequency change of the input signal in the power amplifier.

Additionally, a signal inputted to the digital pre-distorter in the normal mode is not a training signal covering the entire operation region, so a compensation coefficient updated through the adaptation mode cannot properly compensate for the nonlinear characteristics of the power amplifier.

SUMMARY OF THE INVENTION

An object of the present invention is to provide an apparatus and method which reduces distortion of a power amplifier by enhancing nonlinear characteristics of the power amplifier, thereby compensating for a memory effect caused by temperature changes in the power amplifier.

Another object of the present invention is to provide an apparatus and method which reduces distortion of a power amplifier by enhancing nonlinear characteristics of a power amplifier, thereby compensating for a memory effect caused by frequency changes in the power amplifier.

Another object of the present invention is to provide an apparatus and method which reduces distortion of a power amplifier by enhancing nonlinear characteristics of a power amplifier caused by temperature and frequency changes in the power amplifier.

These and other objects and advantages are achieved by providing an apparatus which according to one embodiment includes a digital pre-distorter controller which compares a signal fed back from a power amplifier and an input signal and generates a temperature compensation coefficient or a frequency compensation coefficient based on the comparison. A digital pre-distorter then compensates the input signal using one or more compensation coefficients including at least one of the temperature compensation coefficient and the frequency compensation coefficient generated by the digital pre-distorter controller. The compensation may include increasing the linearity of the power amplifier by pre-distorting an input signal so that it has a temperature and/or frequency distortion characteristic inverse to a temperature and/or frequency distortion characteristic of the amplifier.

In another embodiment, there is further provided an apparatus for compensating for the pre-distortion of a power amplifier including: a digital pre-distorter controller for comparing a signal fed back from a power amplifier and an input signal and generating a power/phase compensation coefficient and a temperature compensation coefficient; an instantaneous power measuring unit for measuring instantaneous power of the input signal; an average power measuring unit for calculating an average power from an output signal of the instantaneous power measuring unit; a look-up table for storing the power/phase compensation coefficient and the temperature compensation coefficient and outputting a compensation coefficient corresponding to the instantaneous power and the average power of the input signal; and a pre-distorter kernel for pre-compensating the input signal by using the power/phase compensation coefficient and the temperature compensation coefficient outputted from the look-up table.

In another embodiment, there is further provided an apparatus for compensating for the pre-distortion of a power amplifier including: a digital pre-distorter controller for comparing a signal fed back from a power amplifier and an input signal and generating a power/phase compensation coefficient and a frequency compensation coefficient; an instantaneous power measuring unit for measuring instantaneous power of the input signal; a look-up table for storing the power/phase compensation coefficient and outputting a compensation coefficient corresponding to the instantaneous power of the input signal; a pre-distorter kernel for pre-compensating the input signal by using the power/phase compensation coefficient outputted from the look-up table; and a correction filter for pre-compensating an output signal of the pre-distorter kernel with the frequency compensation coefficient outputted from the digital pre-distorter controller.

In another embodiment, there is further provided an apparatus for compensating for the pre-distortion of a power amplifier including: a digital pre-distorter controller for comparing a signal fed back from a power amplifier and an input signal and generating a power/phase compensation coefficient, a temperature compensation coefficient and a frequency compensation coefficient; an instantaneous power measuring unit for measuring instantaneous power of the input signal; an average power measuring unit for calculating an average power from an output signal of the instantaneous power measuring unit; a first look-up table for storing the power/phase compensation coefficient and the temperature compensation coefficient and outputting a compensation coefficient according to an instantaneous power and an average power of the input signal; a pre-distorter kernel for pre-compensating the input signal by using the power/phase compensation coefficient and the temperature compensation coefficient outputted from the look-up table; and a correction filter for compensating a frequency distortion characteristic of the power amplifier by applying the frequency compensation coefficient to an output signal of the pre-distorter kernel.

In another embodiment, there is further provided a method for compensating for the pre-distortion of a power amplifier in which a nonlinear characteristics of a power amplifier is compensated, including: generating/storing frequency compensation coefficients and temperature compensation coefficients by instantaneous power or average power levels by using a training signal; and pre-compensating an input signal according to an instantaneous power or an average power of the input signal.

In another embodiment, there is further provided a method for compensating for the pre-distortion of a power amplifier, including: generating temperature compensation coefficients by instantaneous power and average power levels of a training signal; storing the temperature compensation coefficients in a look-up table; applying a temperature compensation coefficient stored in the look-up table according to an instantaneous power and an average power of an input signal; pre-compensating the input signal with the applied temperature compensation coefficient; and re-generating a new temperature compensation coefficient.

In another embodiment, there is further provided a method for compensating for the pre-distortion of a power amplifier, including: generating a reverse frequency compensation coefficient to frequency characteristics of a power amplifier; applying the frequency compensation coefficient to the input signal; and generating a new frequency compensation coefficient.

In another embodiment, there is further provided a method for compensating for the pre-distortion of a power amplifier, including: generating/storing frequency compensation coefficients by average power levels of a training signal; generating/storing temperature compensation coefficients by instantaneous power and average power of a signal compensated by applying the frequency compensation coefficient; pre-compensating an input signal by applying a temperature compensation coefficient corresponding to an instantaneous power and an average power of the input signal; compensating the temperature-compensated signal by using a corresponding frequency compensation coefficient; and re-generating a new frequency compensation coefficient and a new temperature compensation coefficient for a signal fed back through a power amplifier.

In another embodiment, an apparatus compensates for pre-distortion of a power amplifier in which a nonlinear characteristics of a power amplifier is compensated, comprising: a controller that compares a signal fed back from an amplifier and an input signal and generating a temperature compensation coefficient as a frequency compensation coefficient; and a device that compensates for the input signal by using a plurality of compensation coefficient generated by the device.

In another embodiment, an apparatus for compensating pre-distortion of a power amplifier comprising: a device that compares a signal for back from an power amplifier and an input signal and generating a power/phase compensation coefficient and a temperature compensation coefficient; an power measuring unit that measures instantaneous power of the input signal; an average power measuring unit that generates average power from an output signal of the instantaneous power measuring unit; a look-up table that stores the power/phase compensation coefficient and the temperature compensation coefficient and outputting a compensation coefficient corresponding to the instantaneous power and the average power of the input signal; and a pre-distorter kernel that pre-compensates the input signal by using the power/phase compensation coefficient and the temperature compensation coefficient outputted from the look-up table.

In another embodiment, an apparatus for compensating pre-distortion of a power amplifier comprising: a device that compares a signal fed back from a power amplifier and an input signal and generating a power/phase compensation coefficient and a frequency compensation coefficient; a power measuring unit that measures instantaneous power of the input signal; a data retrieval mechanism that stores the power/phase compensation coefficient and outputting a compensation coefficient corresponding to the power of the input signal; a pre-distorter kernel that pre-compensates the input signal by using the power/phase compensation coefficient outputted from the data retrieval mechanism; and a correction mechanism that pre-compensates an output signal of the pre-distorter kernel with the frequency compensation coefficient outputted from the devices.

In another embodiment, a method that compensates for pre-distortion of a power amplifier, comprising: generating temperature related information by instantaneous power and average power levels of a training signal; storing the temperature related information in a look-up table; applying at least one temperature related information stored in the look-up table according to an instantaneous power and an average power of an input signal; pre-compensating the input signal with the applied temperature related information; and re-generating a new temperature related information.

Additional advantages, and features of the invention will be set forth in part in the description which follows and in part will become apparent to those having ordinary skill in the art upon examination of the following or may be learned from practice of the invention. The advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 1:
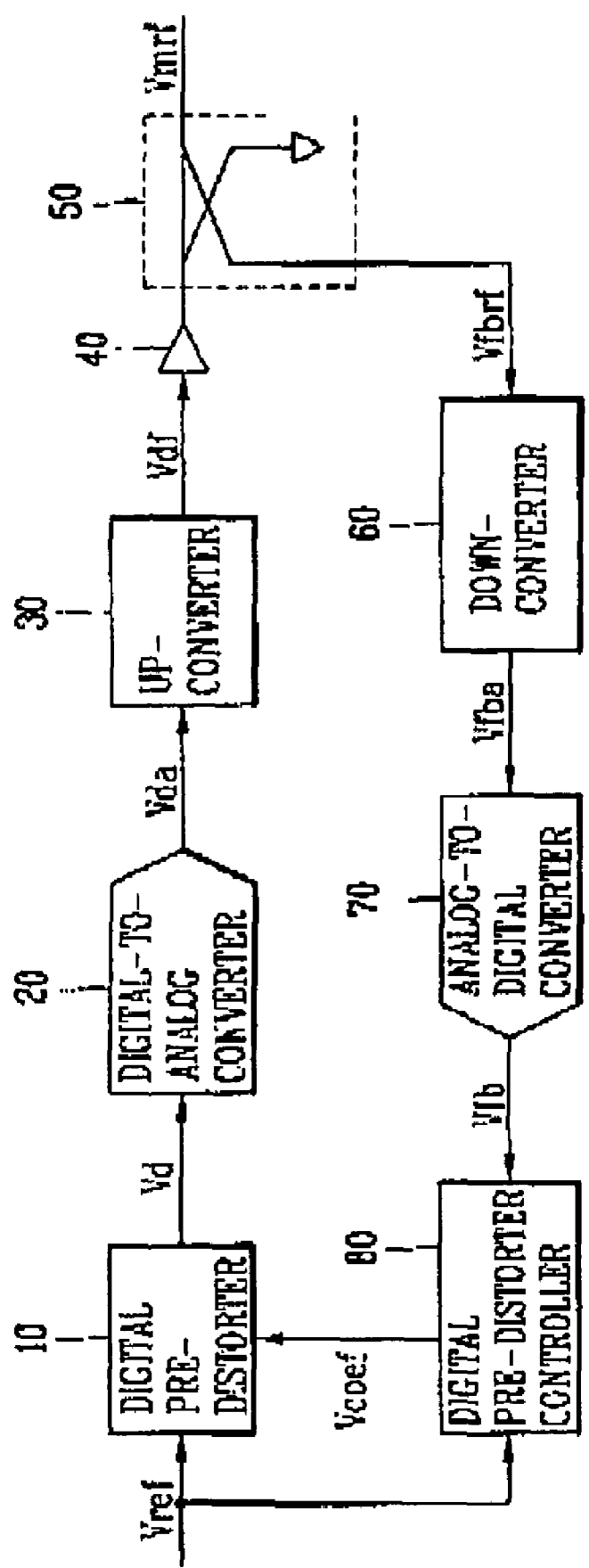
FIG. 1 is a schematic block diagram showing a construction of a general apparatus for compensating for the pre-distortion of a power amplifier.
Figure 2:
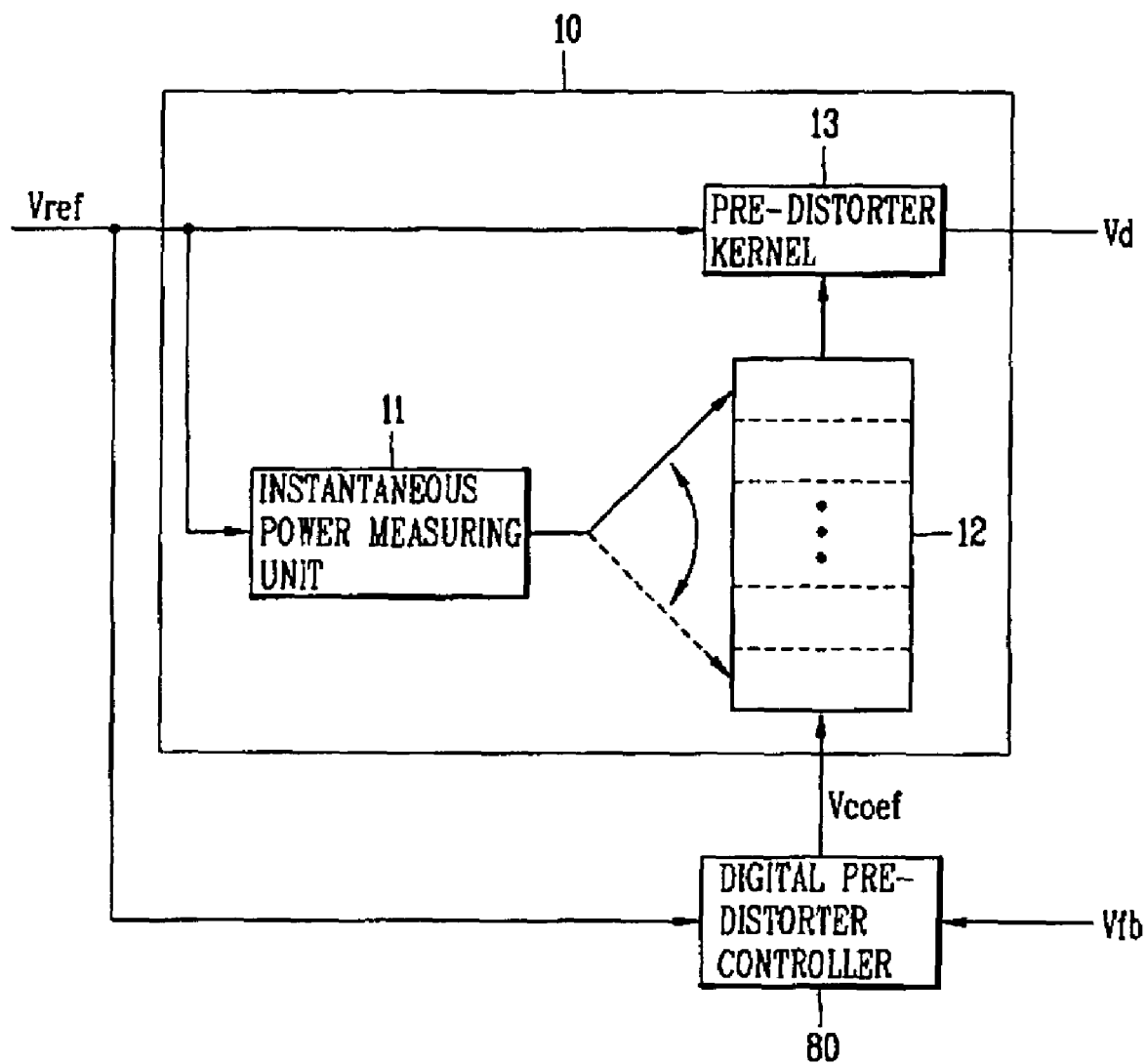
FIG. 2 is a schematic block diagram showing a construction of a digital pre-distorter in accordance with the related art.
Figure 3:
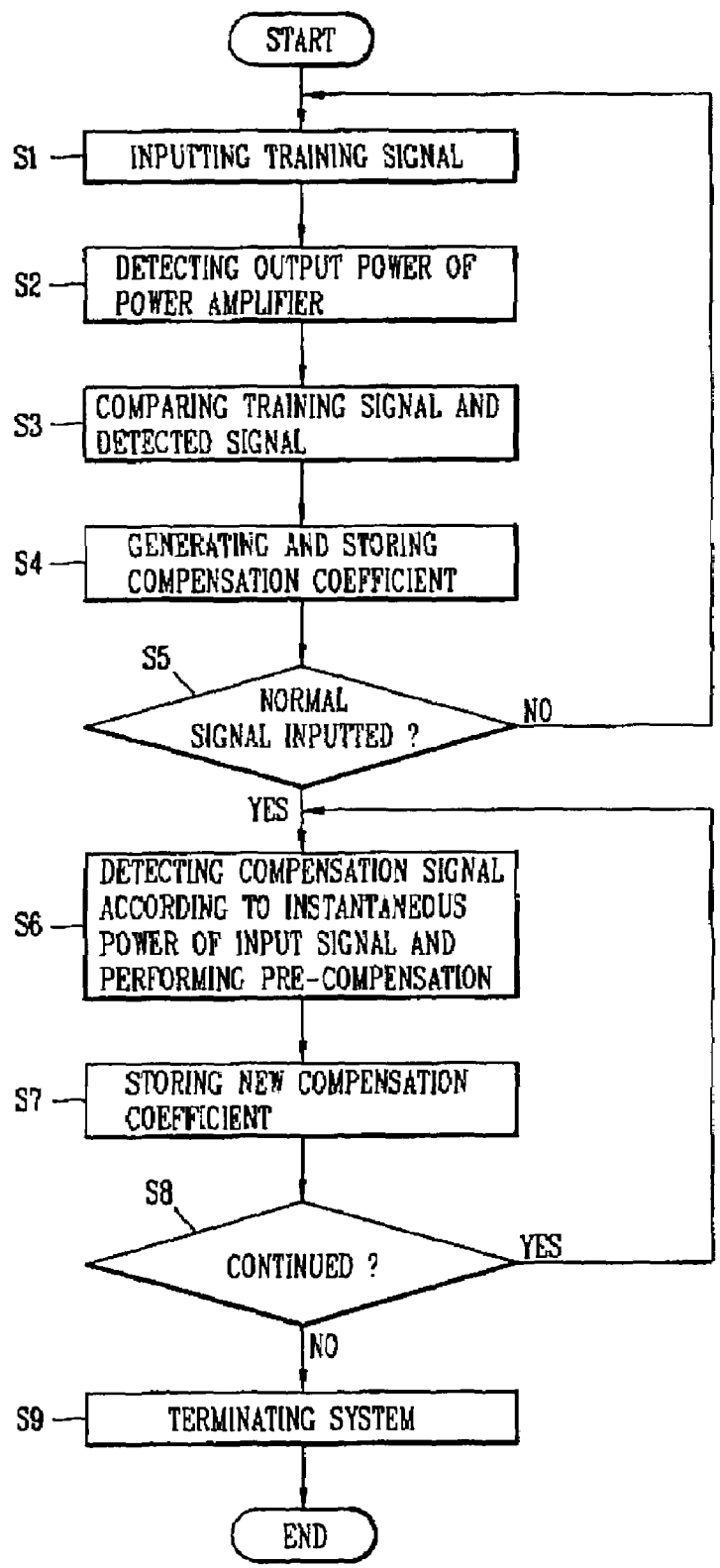
FIG. 3 is a flow chart of a method for compensating for the pre-distortion of a power amplifier in accordance with the related art.
Figure 4A:
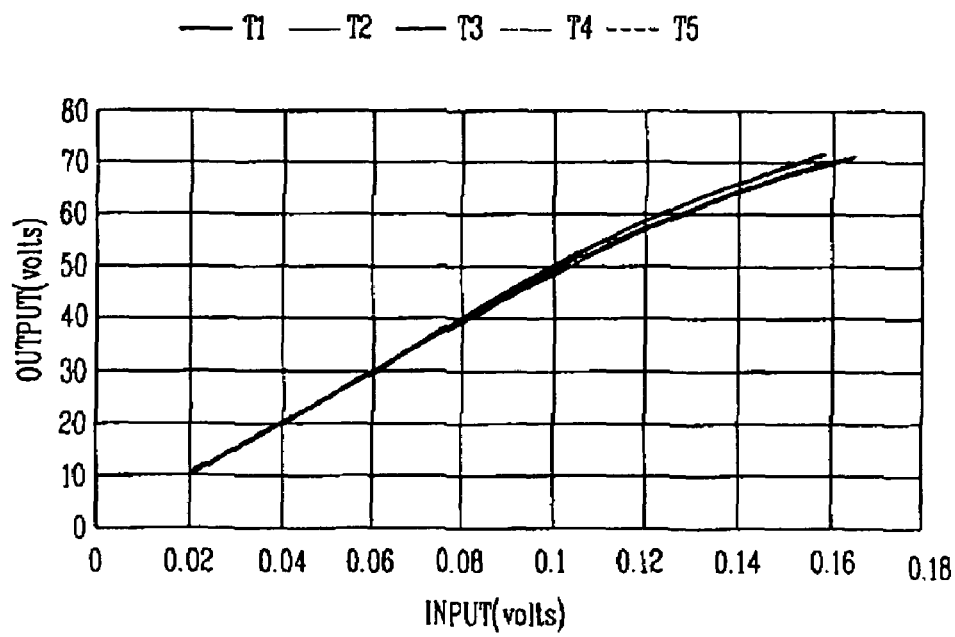
FIGS. 4A and 4B are graphs showing gain and phase characteristics according to a temperature change in a general power amplifier.
Figure 4B:
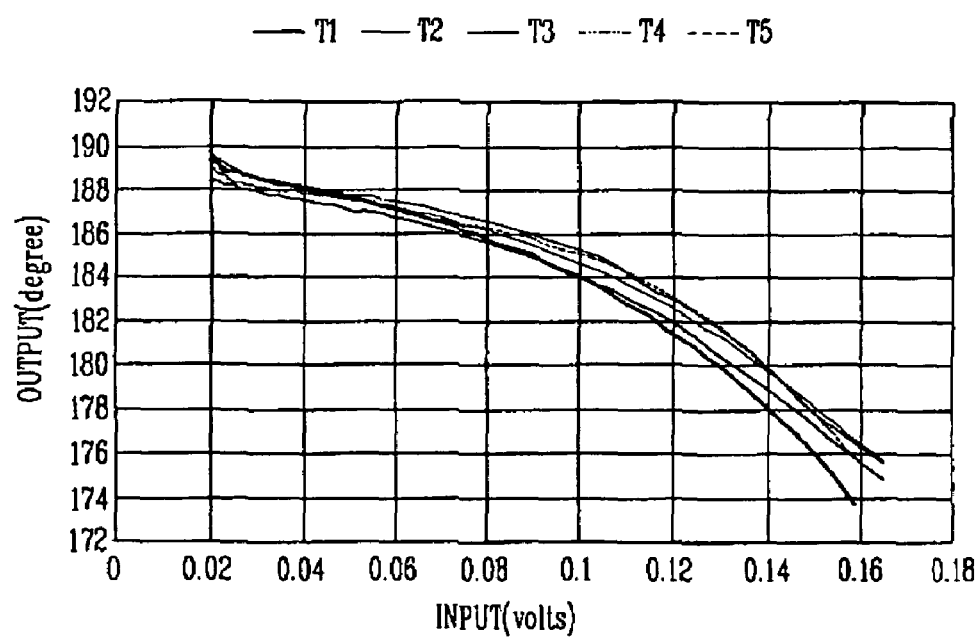
Figure 5A:
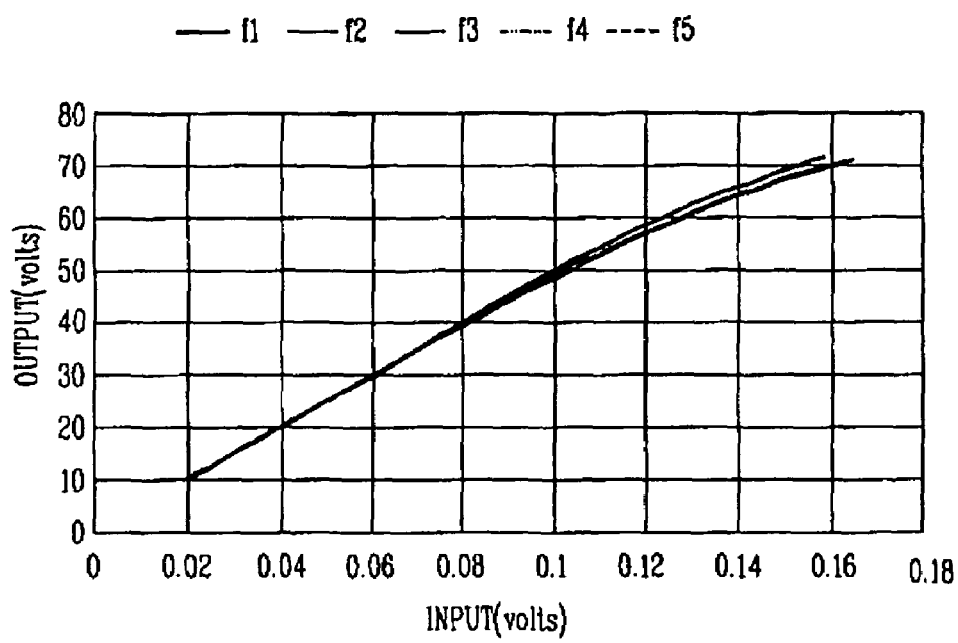
FIGS. 5A and 5B are graphs showing gain and phase characteristics according to a frequency change in the general power amplifier.
Figure 5B:
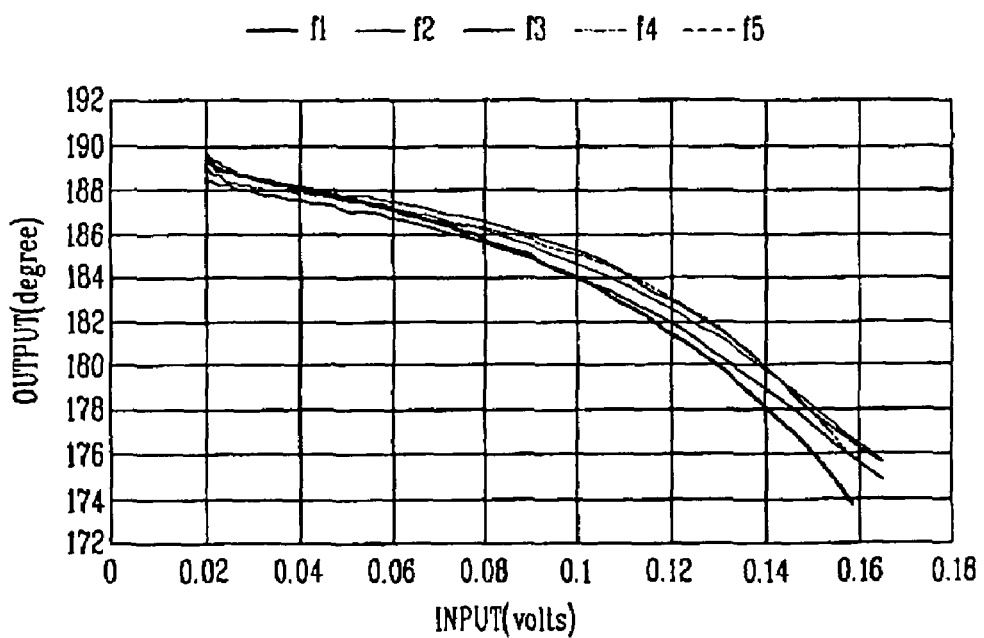
Figure 6:
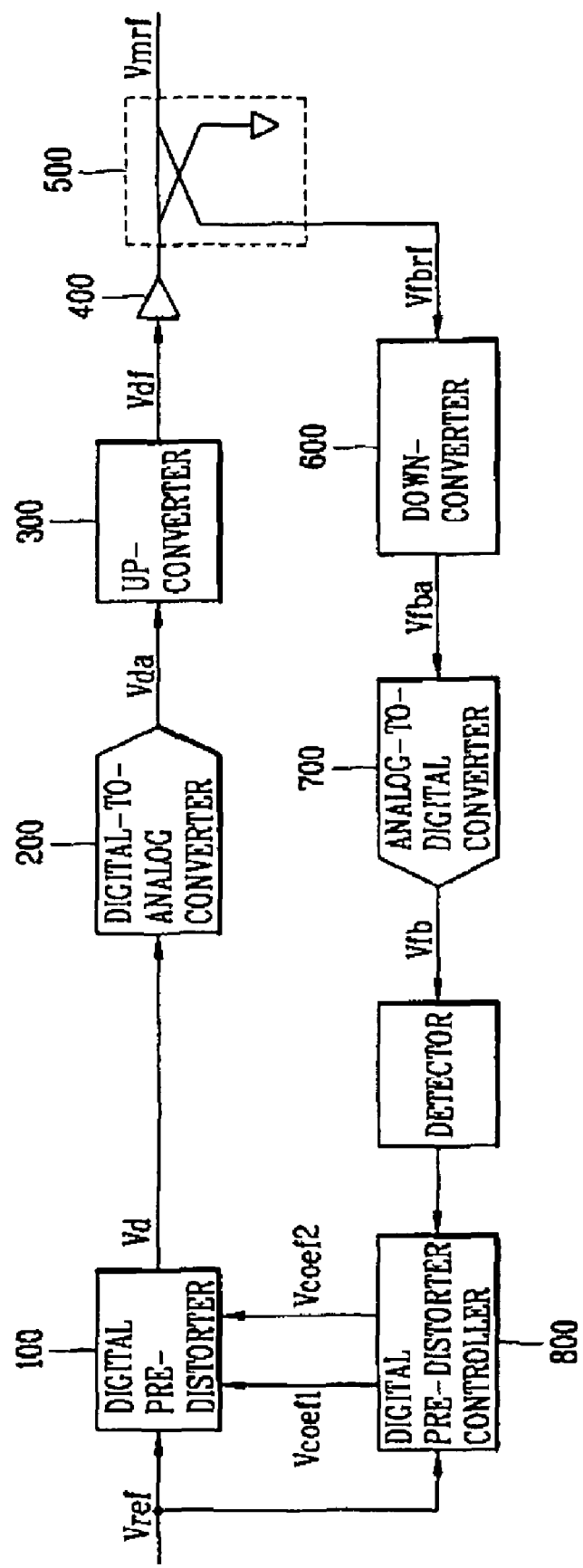
FIG. 6 is a schematic block diagram showing a construction of an apparatus for compensating for the pre-distortion of a power amplifier in accordance with one embodiment of the present invention.

FIG. 6 is a schematic block diagram showing an exemplary construction of an apparatus which compensates for pre-distortion of a power amplifier in accordance with one embodiment of the present invention. This apparatus includes along one signal path a digital pre-distorter 100, a digital-to-analog converter 200, and an up-converter 300. The apparatus includes along another signal path a down-converter 600, an analog-to-digital converter 700, and a digital pre-distorter controller 800.

The digital pre-distorter 100 pre-distorts an input digital signal (Vref) using a first compensation coefficient (Vcoef1) and a second compensation coefficient (Vcoef2). The digital-to-analog converter 200 converts the digital signal applied from the digital pre-distorter 100 into an analog signal (Vda). And the up-converter 300 up-converts the baseband signal (Vda) from the digital-to-analog converter 200 into a radio frequency signal (Vdf).

A power amplifier 400 amplifies the analog radio frequency signal (Vdf) from the up-converter 300 and supplies it to a directional coupler 500. Then, down-converter 600 converts a branched signal $V_{fbrf}$ from the directional coupler 500 into a baseband signal (Vfba). Analog-to-digital converter 700 converts the analog signal (Vfba) into a digital signal (Vfb). And, digital pre-distorter controller 800 compares the signal (Vfb) outputted from the analog-to-digital converter 700 and the baseband digital input signal (Vref) and generates therefrom a first compensation coefficient (Vcoef1) and a second compensation coefficient (Vcoef2) to compensate for nonlinear characteristics caused by temperature and frequency change of the power amplifier 400.

The first compensation coefficient (Vcoef1) corresponds to a power/phase compensation coefficient and the second compensation coefficient (Vcoef2) corresponds to at least one of a temperature compensation coefficient and a frequency compensation coefficient.

The pre-distortion compensating apparatus of the present invention may have the same or similar construction as the related-art one, except that the digital pre-distorter controller 800 generates a compensation coefficient for a temperature and/or operating frequency of the power amplifier and the digital pre-distorter 100 pre-compensates an input signal based on the generated compensation coefficient(s) in order to increase a linearity of the power amplifier in spite of a temperature or frequency (or changes thereto) of the power amplifier.

Figure 7:
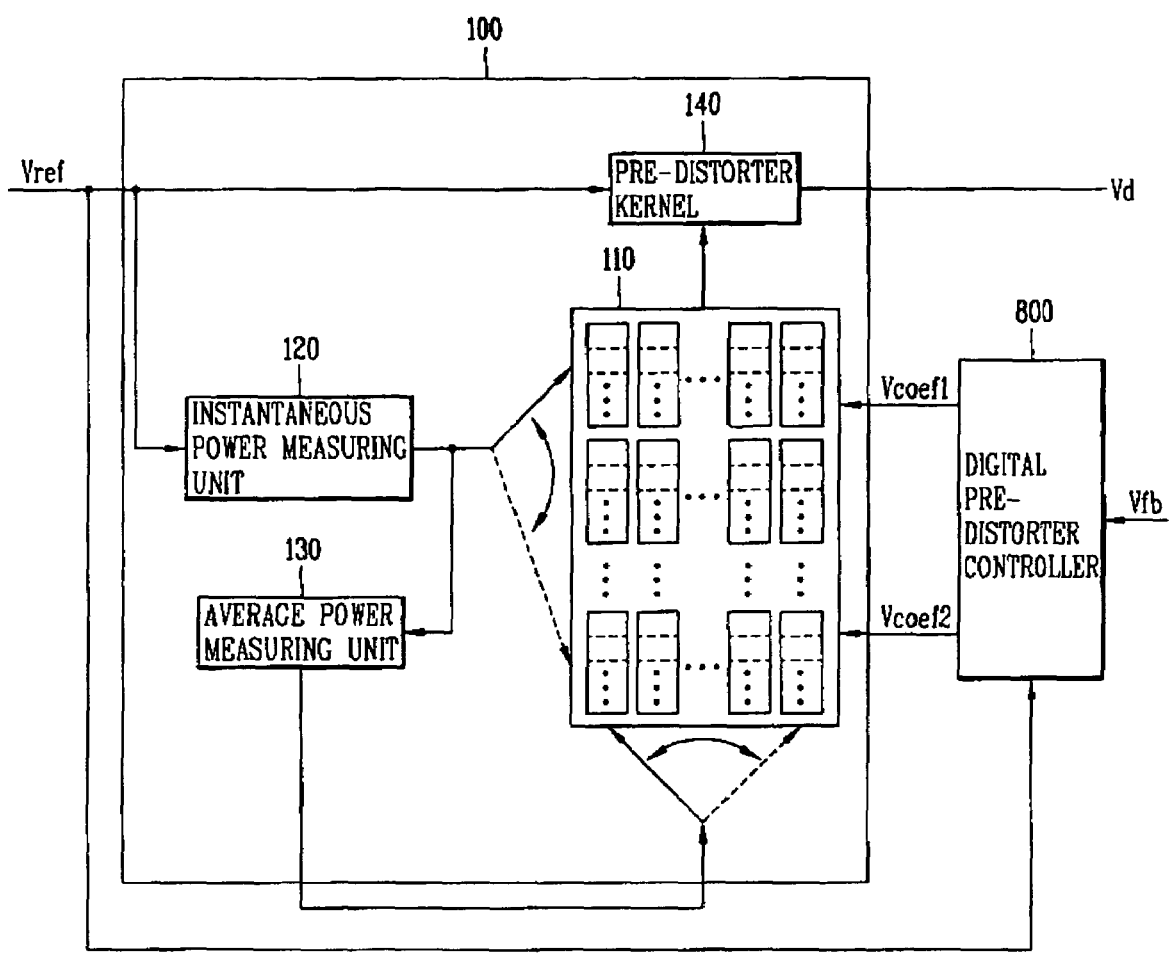
FIG. 7 is a block diagram showing a construction of an apparatus for compensating for the pre-distortion of a power amplifier in order to compensate temperature change characteristics in accordance with one embodiment of the present invention.

FIG. 7 shows one possible implementation of the digital pre-distorter and the manner in which is operates with controller 800. As shown, the digital pre-distorter controller 800 generates a power/phase compensation coefficient and a temperature compensation coefficient based on signal fed back from the power amplifier 400. Digital pre-distorter 100 then linearizes an inputted digital signal using the power/phase compensation coefficient (Vcoef1) and the temperature compensation coefficient (Vcoef2) inputted from the digital pre-distorter controller 800. More specifically, controller 800 compares the signal fed back from the power amplifier 400 with the input signal and generates the power/phase compensation coefficient (Vcoef1) and the temperature compensation coefficient (Vcoef2) in reverse to the power/phase distortion characteristics and the temperature distortion characteristics of the power amplifier 400.

The digital pre-distorter 100 includes a look-up table 110 for storing in a table the power/phase compensation coefficient (Vcoef1) and the temperature compensation coefficient (Vcoef2) applied from the pre-distorter controller 800; an instantaneous power measuring unit 120 for detecting a power level of the input signal (Vref) and outputting it as a control signal of the look-up table 100; an average power measuring unit 130 for calculating an average power of an instantaneous power outputted from the instantaneous power measuring unit 120 and outputting it as a control signal of the look-up table 110; and a pre-distorter kernel 140 for pre-distorting the input signal (Vref) using the power/phase compensation coefficient and the temperature compensation coefficient applied from the look-up table 110 and outputting it.

The temperature of the power amplifier 400 changes depending on the average power of the input signal (Vref). Thus, by changing the average power of the input signal (Vref) and inputting it to the digital pre-distorter 100, different temperatures by average powers can be measured in the power amplifier 400. That is, if an average power of a signal inputted to the power amplifier is high, the temperature inside the power amplifier is high, while if the average power is low, the internal temperature of the power amplifier is low.

The look-up table 110 includes a plurality of tables, each of which includes the power/phase compensation coefficients (Vcoef1) and the temperature compensation coefficients (Vcoef2), which have been applied from the digital pre-distorter controller 800, aligned by average powers. An address of a block in the table is determined on the basis of the power level detected by the instantaneous power measuring unit 120.

Figure 8:
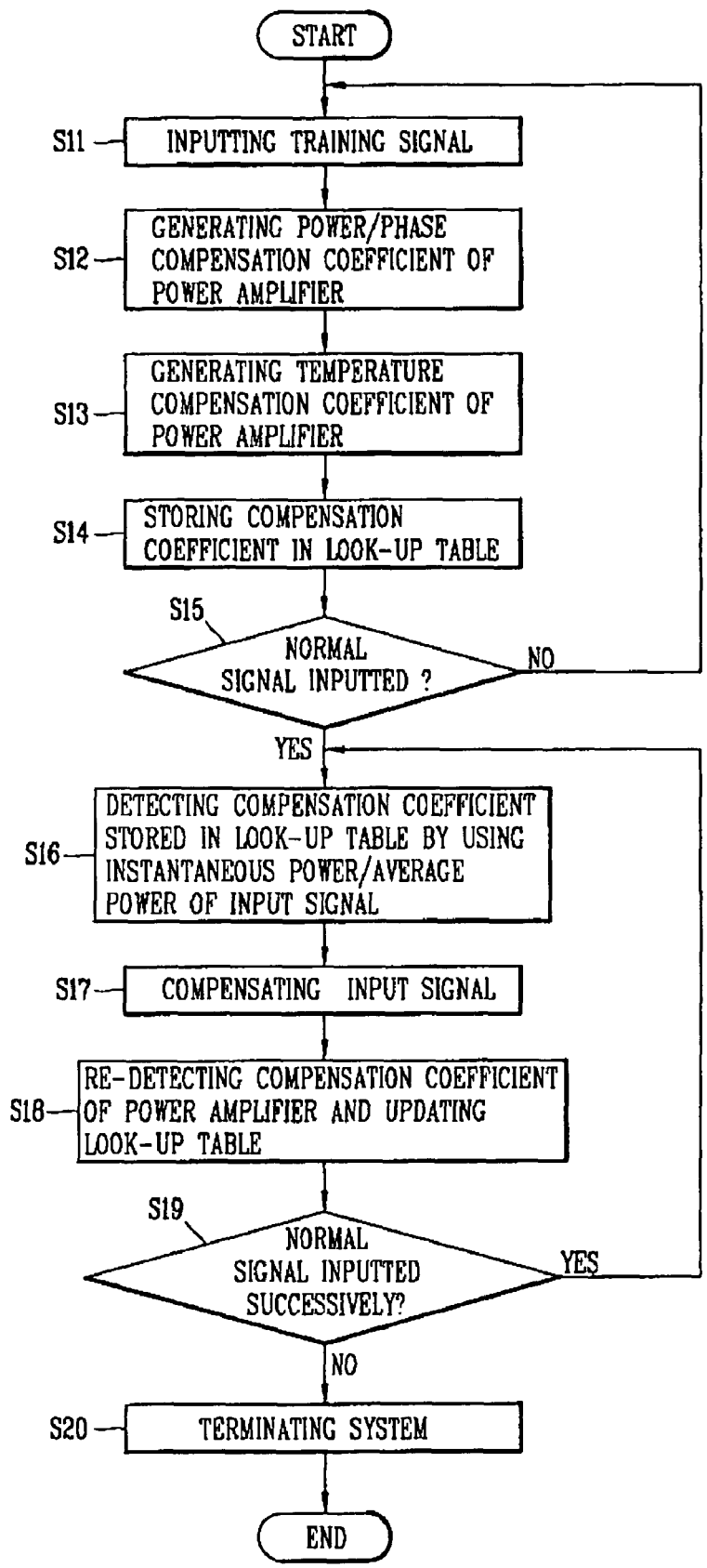
FIG. 8 is a flow chart of a method for compensating for the pre-distortion of a power amplifier in order to compensate temperature change characteristics in accordance with one embodiment of the present invention.

FIG. 8 is a flow chart of a method for compensating pre-distortion of a power amplifier in accordance with the present invention. Operation of the pre-distortion compensating apparatus of FIG. 7 may be explained with reference to this method.

The operation of the pre-distortion compensating apparatus of the present invention roughly includes three modes: an initial mode for measuring nonlinear characteristics of a power amplifier; a normal mode for compensating an input signal by using a compensation coefficient detected in the initial mode and outputting it; and an adaptation mode for generating a compensation coefficient for the nonlinear characteristics of the power amplifier occurring in the normal mode and continuously updating/storing it.

In the initial mode, a training signal is inputted to the digital pre-distorter 100 (step S11). The training signal passes through the digital-to-analog converter 200 and the up-converter 300, and is applied to the power amplifier 400. The training signal is amplified in and outputted from the power amplifier 400, passes through the down-converter 600 and the analog-to-digital converter 700, and is inputted to the digital pre-distorter controller 800.

Upon receiving the signal (Vfb), the digital pre-distorter controller 800 compares it with the input signal (Vref) and generates a power/phase compensation coefficient (Vcoef1) to compensate power/phase distortion characteristics of the power amplifier 500 (step S12). After the compensation for the power/phase has been made, the digital pre-distorter controller 800 also generates the temperature compensation coefficient (Vcoef2) of the power amplifier 400 (step S13).

The power/phase compensation coefficient (Vcoef1) and the temperature compensation coefficient (Vcoef2) are transmitted to the look-up table 110 and stored in a block designated by a corresponding instantaneous power measuring unit 120 of a table designated by the average power measuring unit 130 (step S14). That is, compensation coefficients corresponding to each power level are generated by controlling the instantaneous power and average power of the training signal, and then stored in corresponding tables of the look-up table 110. After the compensation coefficients are stored in the look-up table 110, if a normal signal is not inputted to the digital pre-distorter 100, the compensation coefficients are generated using the training signal and stored (step S15).

When the normal signal is inputted to the digital pre-distorter 100, a power/phase compensation coefficient and temperature compensation coefficient stored in the look-up table 110 is applied to the pre-distorter kernel 140 according to an instantaneous power and an average power of the normal signal measured by the instantaneous power measuring unit 120 and the average power measuring unit 130 (step S16). At this time, the instantaneous power and the average power are used as addresses for extracting the compensation coefficient stored in the look-up table 110.

The digital pre-distorter 100 compensates the power/phase distortion characteristics and temperature distortion characteristics of the input signal (Vref) using the received power/phase compensation coefficient and the temperature compensation coefficient and outputs it (step S17), and the pre-compensated signal (Vd) is outputted through the power amplifier 400 and fed back to the digital pre-distorter controller 800.

The digital pre-distorter controller 800 compares the fed-back signal (Vfb) with the input signal (Vref) to re-analyze the output characteristics of the power amplifier 400. If a new power/phase compensation coefficient (Vcoef1) and a new temperature compensation coefficient (Vcoef2) are generated, the digital pre-distorter controller 800 stores the new compensation coefficients for updating (step S18). At this time, the generated compensation coefficients are stored in a block of a table corresponding to the instantaneous power and the average power measured by the instantaneous power measuring 120 and the average power measuring unit 130.

And then, it is judged whether a successively inputted signal is a normal signal or not (step S19). If the inputted signal is a normal signal, the process of pre-compensating the input signal and updating the compensation coefficient are continually performed. If, however, the inputted signal is not a normal signal, the process is terminated (step S20).

Figure 9:
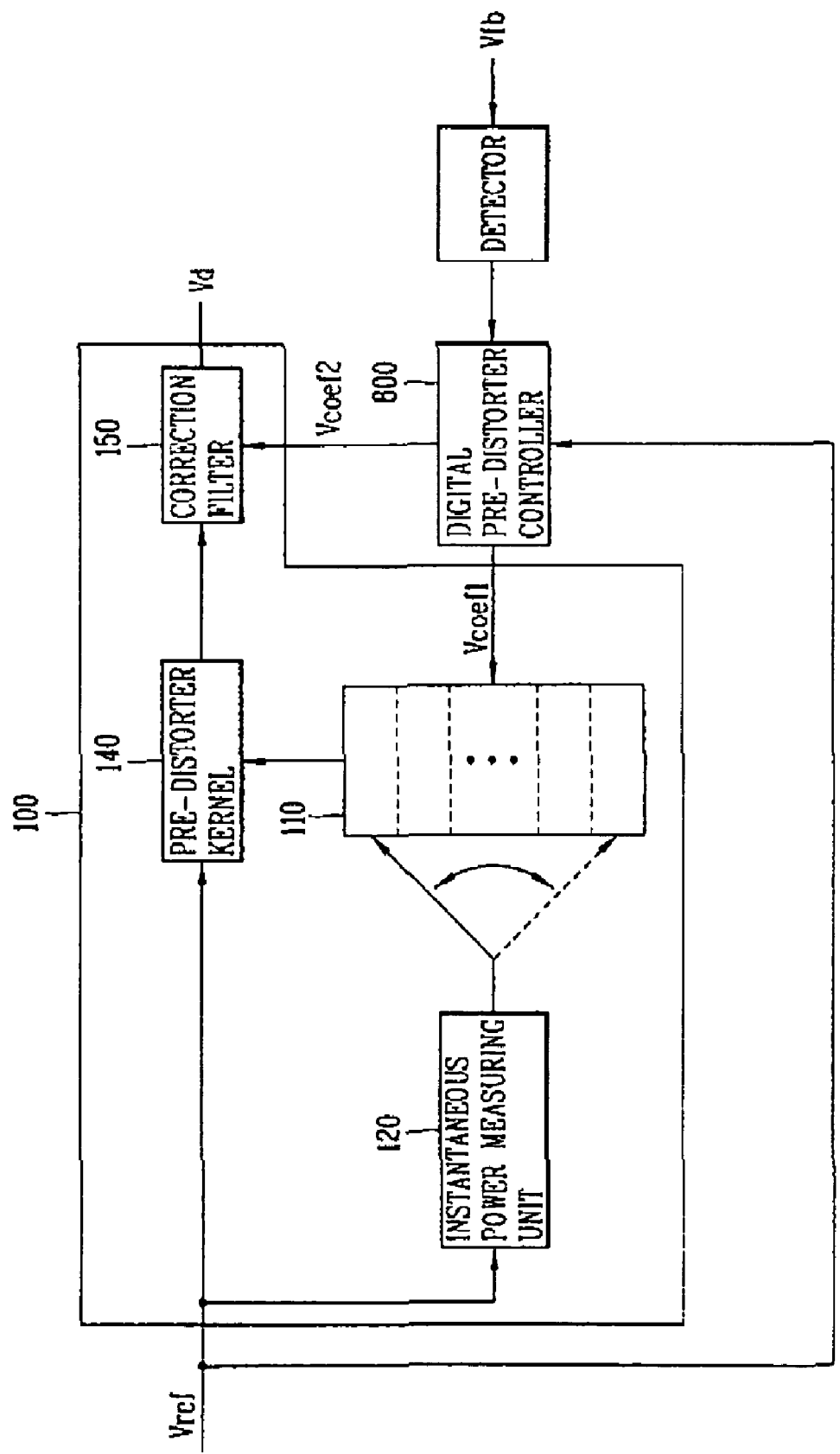
FIG. 9 is a block diagram showing a construction of an apparatus for compensating for the pre-distortion of a power amplifier in order to compensate frequency characteristics in accordance with one embodiment of the present invention.

FIG. 9 is a block diagram showing an apparatus which compensates for the pre-distortion of a power amplifier in order to compensate the memory effect caused by frequency characteristics in accordance with the present invention. This apparatus includes a digital pre-distorter controller 800 for generating power/phase compensation coefficient (Vcoef1) and a frequency compensation coefficient (Vcoef2) of the power amplifier, and a digital pre-distorter 100 for pre-compensating an input signal with the power/phase compensation coefficient and the frequency compensation coefficient inputted from the digital pre-distorter controller 800.

The digital pre-distorter 100 includes: a look-up table 100 for storing the power/phase compensation coefficient (Vcoef1) applied from the digital pre-distorter controller 800; an instantaneous power measuring unit 120 for measuring instantaneous power of the input signal (Vref) and outputting it as a control signal of the look-up table 110; a pre-distorter kernel 140 for compensating the input signal by using the power/phase compensation coefficient applied from the look-up table 110; and a correction filter (equalizer) 150 for compensating a signal applied from the pre-distorter kernel 140 with the frequency compensation coefficient (Vcoef2) inputted from the digital pre-distorter controller 800 and outputting it.

The look-up table 110 is divided into a plurality of blocks, each of which stores the power/phase compensation coefficient (Vcoef1) applied from the digital pre-distorter controller 800. At this time, the look-up table 110 stores power/phase compensation coefficients by power levels detected by the instantaneous power measuring unit 120.

Figure 10:
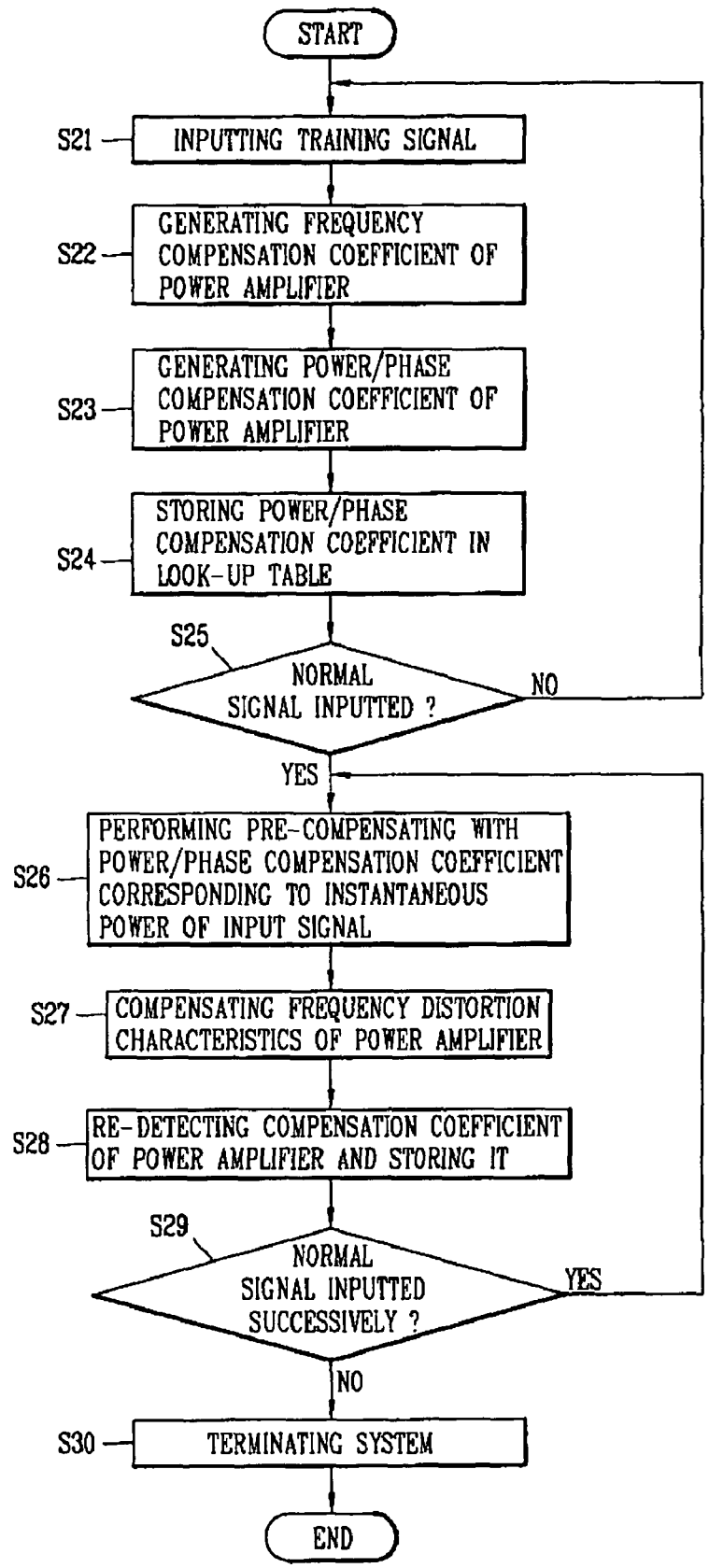
FIG. 10 is a flow chart of a method for compensating for the pre-distortion of a power amplifier in order to compensate frequency characteristics in accordance with one embodiment of the present invention.

FIG. 10 is a flow chart of a method for compensating for the pre-distortion of a power amplifier. Operation of the pre-distortion compensating apparatus of FIG. 9 may be described with reference to this flow chart.

A training signal for measuring nonlinear characteristics of the power amplifier is inputted to the digital pre-distorter 100 (step S1). The training signal is applied to the power amplifier through the digital-to-analog converter and the up-converter, and then inputted to the digital pre-distorter controller 800 through the power amplifier, the down-converter and the analog-to-digital converter.

The digital pre-distorter controller 800 compares the training signal received through the power amplifier with an initial input signal and generates a power/phase compensation coefficient (Vcoef1) and a frequency compensation coefficient (Vcoef2) of the power amplifier (steps S22 and S23).

The power/phase compensation coefficient (Vcoef1) is transmitted to the look-up table 110 and stored in a block designated by the instantaneous power measuring unit 120, while the frequency compensation coefficient (Vcoef2) is transmitted to the correction filter 150 (step S24).

After the compensation coefficient is stored in the look-up table 110, compensation coefficients are generated by power levels by using the training signal and stored until a normal signal is inputted to the digital pre-distorter 100. When a normal signal is inputted to the digital pre-distorter 100 (step S25), a power/phase compensation coefficient stored in the look-up table 110 corresponding to the instantaneous power measured by the instantaneous power measuring unit 120 is applied to the pre-distorter kernel 140.

The pre-distorter kernel 140 applies the power/phase compensation coefficient to the input signal (Vref) to compensate for the power/phase distortion characteristics of the power amplifier and output it (step S26). The correction filter 150 compensates the signal outputted from the pre-distorter kernel 140 with the frequency compensation coefficient (Vcoef2) received from the digital pre-distorter controller 800 and outputs it (step S27).

The signal (Vd) outputted from the digital pre-distorter 100 is inputted to the power amplifier, from which a portion of the signal (Vd) is outputted, and the remaining portion is fed back to the digital pre-distorter 800.

The digital pre-distorter controller 800 re-analyzes output characteristics of the power amplifier by comparing the feedback signal (Vfb) with the input signal (Vref). When a new power/phase compensation coefficient (Vcoef1) is generated, the compensation coefficient is stored to update the look-up table 110 (step S28). The newly generated power/phase compensation coefficient is stored in the block corresponding to the instantaneous power measured by the instantaneous power measuring unit 120.

Again, it is judged that a successively inputted signal is a normal signal (step S29). If the signal is a normal signal, the process of pre-compensating the input signal and updating the compensation coefficient is performed. If the inputted signal is not a normal signal, the process is terminated (step S30).

Figure 11:
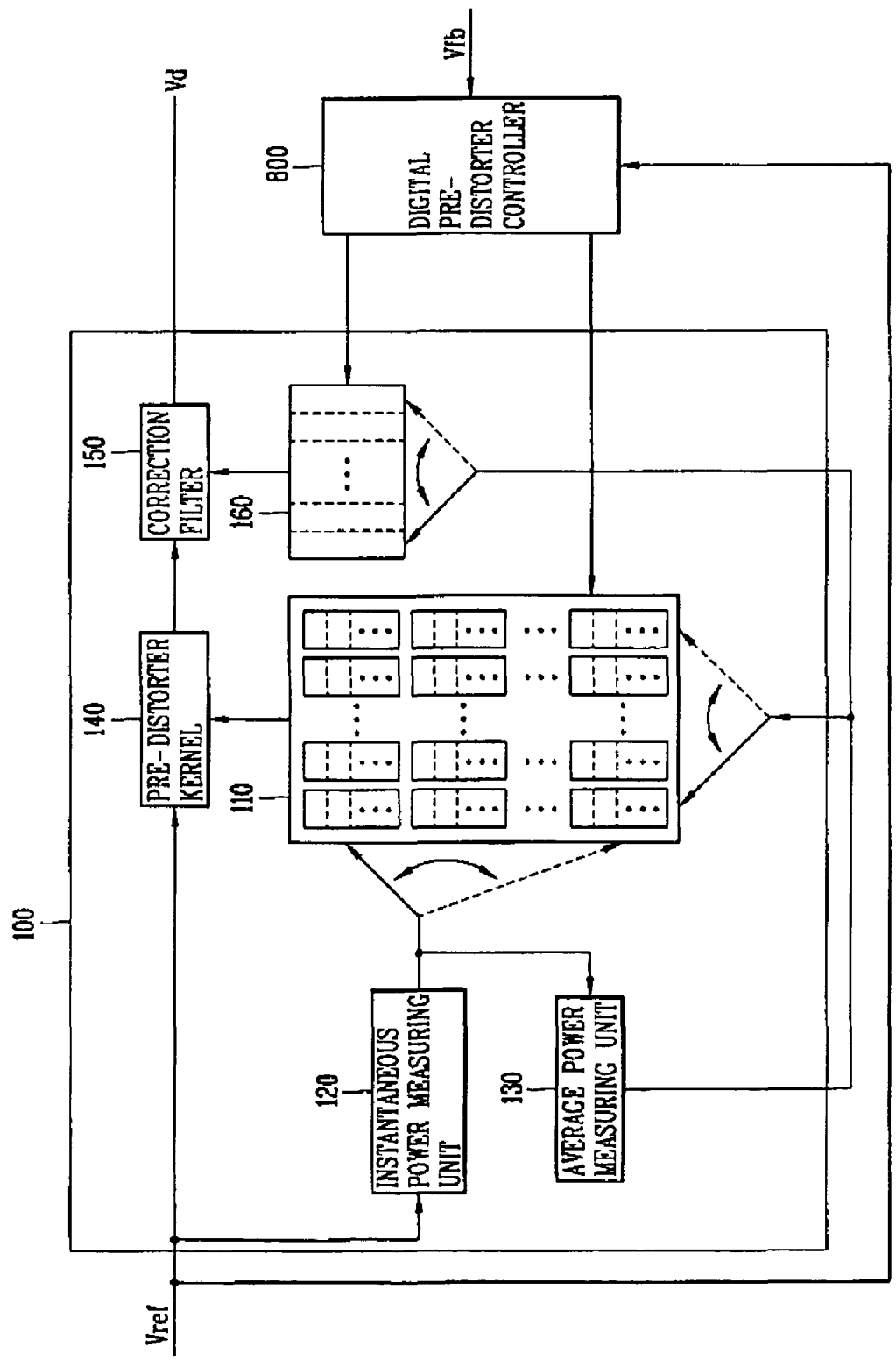
FIG. 11 is a block diagram showing a construction of an apparatus for compensating for the pre-distortion of a power amplifier in order to compensate wide band frequency and temperature distortion characteristics in accordance with one embodiment of the present invention.

FIG. 11 is a block diagram showing a construction of an apparatus for compensating for the pre-distortion of a power amplifier in order to compensate wide band frequency and temperature distortion characteristics in accordance with the present invention.

As shown in FIG. 11, the pre-distortion compensating apparatus includes: a digital pre-distorter controller 800 for generating power/phase compensation coefficient, a temperature compensation coefficient and a frequency compensation coefficient for compensating nonlinear characteristics of the power amplifier by comparing a signal fed back from the power amplifier with an input signal; and a digital pre-distorter 100 for extracting a compensation coefficient corresponding to the input signal (Vref) from compensation coefficients stored after being inputted from the digital pre-distorter controller 800, and pre-compensating the input signal with the compensation coefficient.

The digital pre-distorter 100 includes: a first look-up table 110 for storing the power/phase compensation coefficient and the temperature compensation coefficient (Vcoef1) generated by the digital pre-distorter controller 800; a second look-up table 160 for storing the frequency compensation coefficient (Vcoef2) generated by the digital pre-distorter controller 800; an instantaneous power measuring unit 120 for measuring an instantaneous power of the input signal (Vref) and outputting it as a control signal of the first look-up table 110; an average power measuring unit 130 for calculating an average power of the instantaneous power outputted from the instantaneous power measuring unit 120 and outputting it as a control signal of the first and second look-up tables 110 and 160; a pre-distorter kernel 140 for compensating an input signal by using the power/phase compensation coefficient and the temperature compensation coefficient applied from the first look-up table 110; and a correction filter 150 for compensating an output signal of the pre-distorter kernel 140 by using the frequency compensation coefficient applied from the second look-up table 160.

The first look-up table 110 includes a plurality of tables. The tables are aligned according to the power/phase compensation coefficient and the temperature compensation coefficient applied from the digital pre-distorter controller 800. An address of a block in the table is determined on the basis of the instantaneous power.

The second look-up table 160 discriminates the frequency compensation coefficient (Vcoef2) applied from the digital pre-distorter controller 800 on the basis of the average power and stores it.

Figure 12:
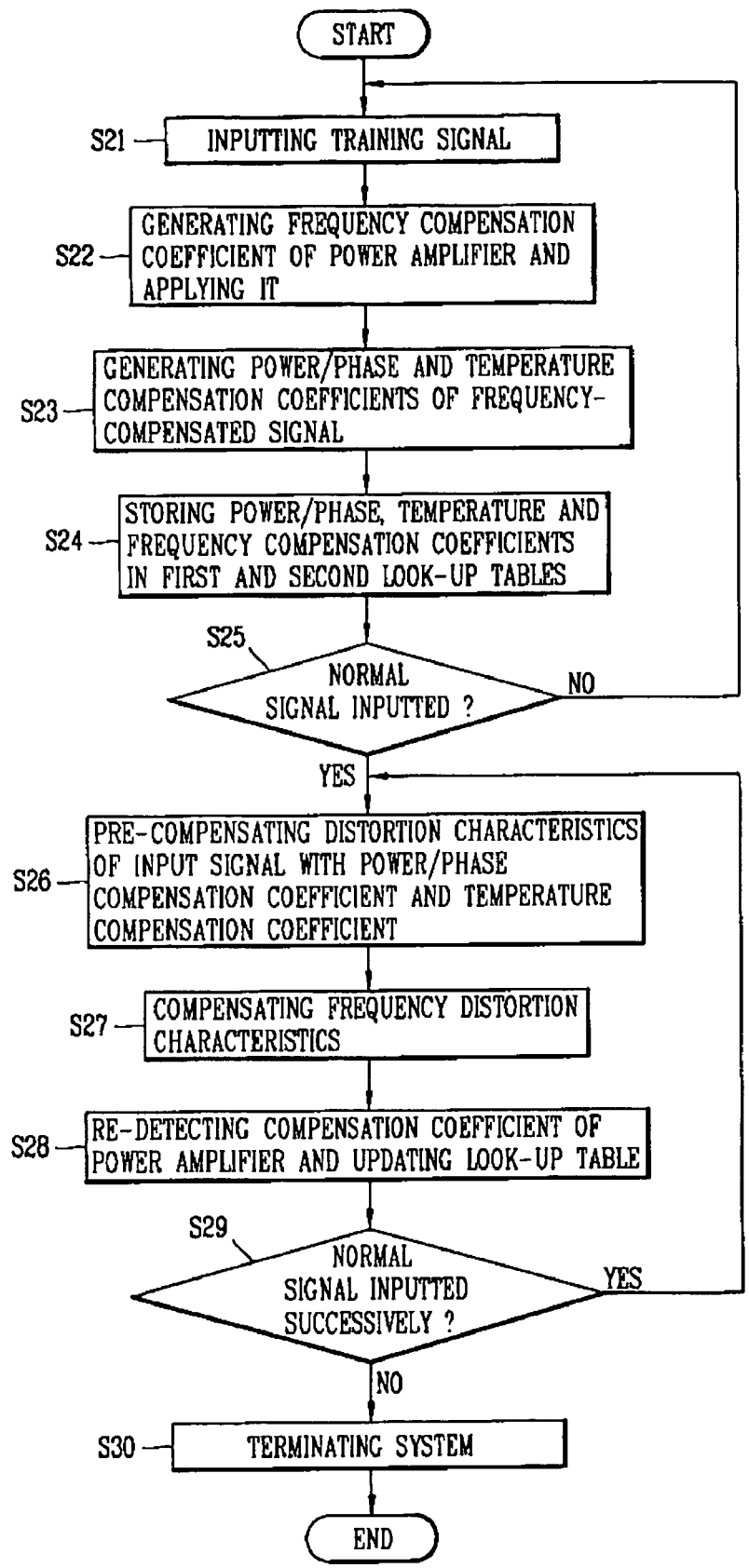
FIG. 12 is a flow chart of a method for compensating pre-distortion of a power amplifier in order to compensate wide band frequency and temperature distortion characteristics in accordance with one embodiment of the present invention.

FIG. 12 is a flow chart of a method for compensating for the pre-distortion of a power amplifier in accordance with the present invention. The operation of the pre-distortion compensating apparatus of FIG. 11 will now be described with reference to FIG. 12.

When a training signal is inputted to the digital pre-distorter after passing through the power amplifier (step S21), the digital pre-distorter controller 800 compares the feedback training signal with a training signal (Vref) before being fed back and generates a frequency compensation coefficient (Vcoef2) for compensating frequency distortion characteristics of the power amplifier (step S22).

The frequency compensation coefficient (Vcoef2) is transmitted to the second look-up table 160 and stored in a block designated by the average power measuring unit 130. An average power of the training signal is controlled and frequency compensation coefficients (Vcoef2) generated according to each average power are stored in corresponding blocks of the second look-up table.

A memory effect due to a temperature is compensated by using the training signal which has been compensated for a memory effect due to a frequency by using the frequency compensation coefficient.

The frequency-compensated training signal is inputted to the digital pre-distorter controller 800 through the power amplifier. The pre-distorter controller 800 compares the feedback training signal with the training signal before being fed back and generates a power/phase compensation coefficient and a temperature compensation coefficient (Vcoef1) for compensating power/phase distortion characteristics and temperature distortion characteristics of the power amplifier (step S23).

The power/phase compensation coefficient and the temperature compensation coefficient (Vcoef1) are stored in the first look-up table 110 (step S24). The compensation coefficients are grouped according to an average power of an input signal to form tables, and storage blocks are designated by an instantaneous power in each table.

In this manner, until a normal signal is inputted to the digital pre-distorter 100, the compensation coefficients are generated by power levels and stored in the first and second look-up tables 110 and 160.

When a normal signal is inputted to the digital pre-distorter 100 (step S25), the power/phase compensation coefficient and the temperature compensation coefficient stored in the first look-up table 110 designated by an instantaneous power and an average power of the normal signal are applied to the pre-distorter kernel 140. That is, by using the instantaneous power and the average power of the input signal as addresses, the compensation coefficients stored in corresponding blocks are extracted.

The pre-distorter kernel 140 pre-compensates the power/phase distortion characteristics and temperature distortion characteristics of the power amplifier by applying the power/phase compensation coefficient and the temperature compensation coefficient to the input signal (Vref) (step S26).

The signal compensated in the pre-distorter kernel 140 is applied to the correction filter 150 and frequency-compensated (step S27). That is, when the signal is inputted to the correction filter 150, the frequency compensation coefficient is applied from the second look-up table 160 and the correction filter 150 pre-compensates the signal applied from the pre-distortor kernel 140. The frequency compensation coefficient is a value stored in the block designated by an average value of the normal signal.

A signal outputted from the correction filter 150 is outputted after passing through the power amplifier, a portion of which is fed back to the digital pre-distorter controller 800. The digital pre-distorter controller 800 compares the feedback signal (Vfb) with the input signal (Vref) and reanalyzes output characteristics of the power amplifier. If a new power/phase compensation coefficient, a new temperature compensation coefficient (Vcoef1) or a new frequency compensation coefficient (Vcoef2) are generated, the digital pre-distorter controller 800 stores the corresponding compensation coefficient in the first look-up table 110 or in the second look-up table 160, for updating (step S28). The newly generated compensation coefficients are stored in a block corresponding to an average power measured by the average power measuring unit 130.

Again, it is judged whether a successively inputted signal is a normal signal (step S29). If the signal is a normal signal, the process of pre-compensating the input signal and updating the compensation coefficient is performed. If the inputted signal is not a normal signal, the process is terminated (step S30).

Figure 13:
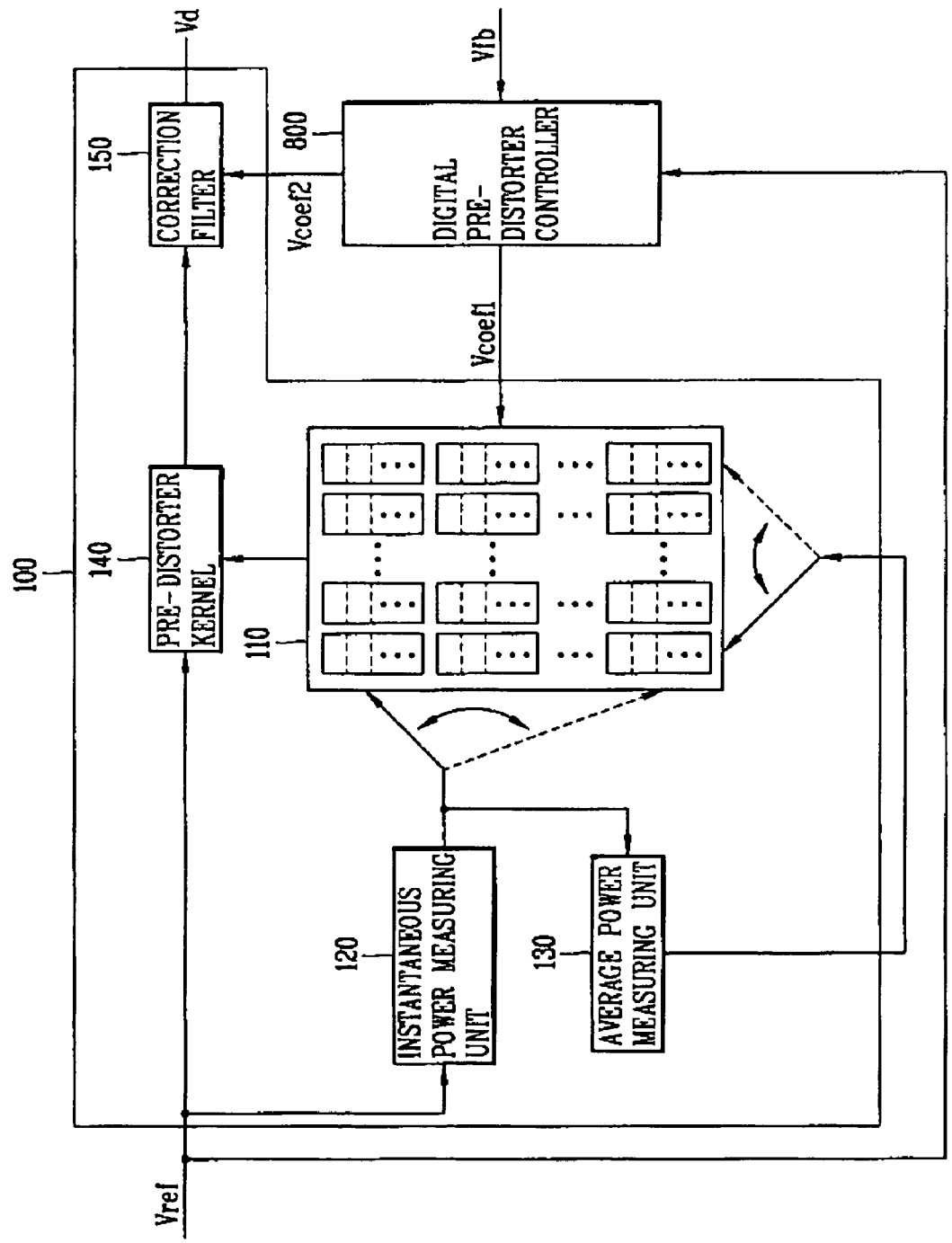
FIG. 13 is a block diagram showing a construction of an apparatus for compensating pre-distortion of a power amplifier in order to compensate narrow band frequency and temperature distortion characteristics in accordance with one embodiment of the present invention.

FIG. 13 is a block diagram showing a construction of an apparatus for compensating for the pre-distortion of a power amplifier in order to compensate narrow band frequency and temperature distortion characteristics in accordance with the present invention. As shown in FIG. 13, the pre-distortion compensating apparatus of the present invention includes: a digital pre-distorter controller 800 for generating power/phase compensation coefficient, a temperature compensation coefficient and a frequency compensation coefficient for compensating nonlinear characteristics of the power amplifier by comparing a signal (Vfb) fed back from the power amplifier with a narrow-band input signal (Vref); a look-up table 110 for storing the power/phase compensation coefficient and the temperature compensation coefficient (Vcoef1) generated by the digital pre-distorter controller 800; an instantaneous power measuring unit 120 and an average power measuring unit 130 respectively for measuring an instantaneous power and an average power of the input signal (Vref) and outputting it as a control signal of the look-up table 110; a pre-distorter kernel 140 for compensating an input signal by using the power/phase compensation coefficient and the temperature compensation coefficient applied from the look-up table 110; and a correction filter 150 for compensating an output signal of the pre-distorter kernel 140 by using the frequency compensation coefficient (Vcoef2) transmitted from the digital pre-distorter controller 800 and outputting it.

The look-up table 110 includes a plurality of tables discriminating the power/phase compensation coefficient and the temperature compensation coefficient (Vcoef1) by average powers, and each table includes blocks for discriminating and storing the compensation coefficients according to the instantaneous power.

Figure 14:
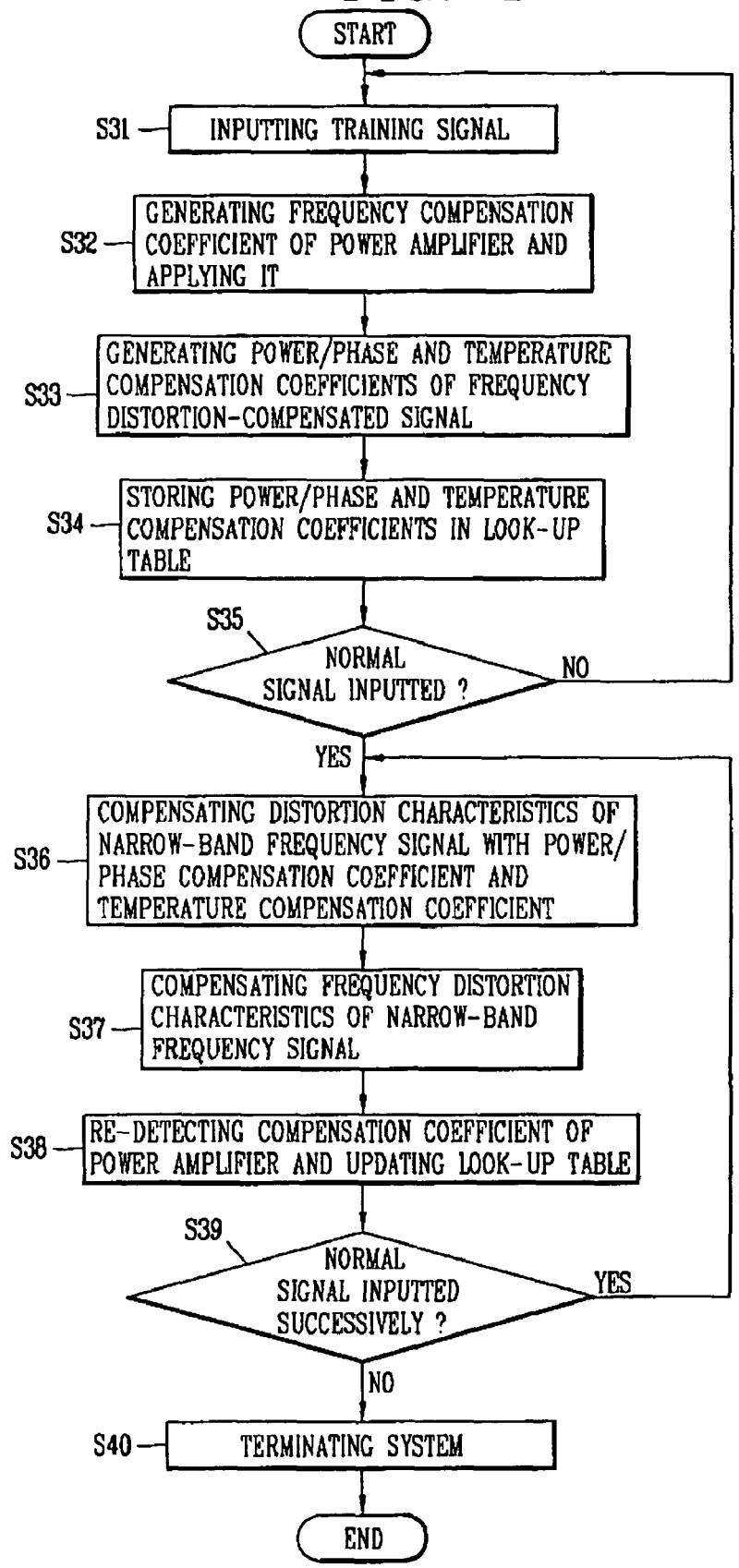
FIG. 14 is a flow chart of a method for compensating pre-distortion of a power amplifier in order to compensate narrow band frequency and temperature distortion characteristics in accordance with one embodiment of the present invention.

FIG. 14 is a flow chart of a method for compensating for the pre-distortion of a power amplifier in accordance with the present invention. The operation of the pre-distortion compensating apparatus of FIG. 13 will now be described with reference to FIG. 14.

A training signal is amplified in and outputted from the power amplifier and then inputted to the digital pre-distorter controller 800 (step S31). The digital pre-distorter controller 800 compares the training signal fed back from the power amplifier with the training signal before the feed back and generates a frequency compensation coefficient (Vcoef2) for compensating narrow-band frequency distortion characteristics (step S32).

The training signal, of which a memory effect according to the frequency distortion characteristics has been compensated by applying the frequency compensation coefficient (Vcoef2), is inputted to the digital pre-distorter controller 800 through the power amplifier.

The digital pre-distorter controller 800 compares the feedback training signal with the training signal inputted to the power amplifier and generates power/phase compensation coefficients and temperature compensation coefficient (Vcoef1) by each average power steps (step S33).

The power/phase compensation coefficient and the temperature compensation coefficient (Vcoef1) generated in the digital pre-distorter controller 800 are stored in the look-up table 110 which includes tables grouped by each average powers (step S34). In this case, the power/phase compensation coefficient and the temperature compensation coefficient (Vcoef1) are stored in corresponding blocks according to an instantaneous power of the input signal (Vref).

When the narrow-band frequency signal is inputted to the digital pre-distorter 100 (step S35), a power/phase compensation coefficient and a temperature compensation coefficient corresponding to an instantaneous power and an average power of the narrow-band frequency signal are applied to the pre-distorter kernel 140.

The pre-distorter kernel 140 applies the power/phase compensation coefficient and the temperature compensation coefficient to the narrow-band frequency signal to compensate power/phase distortion characteristics and temperature distortion characteristics of the power amplifier and output it (step S36).

The correction filter 150 pre-compensates the signal outputted after being temperature-compensated in the pre-distorter kernel 140 by using the frequency compensation coefficient (Vcoef2) applied from the digital pre-distorter controller 800 (step S37). At his time, as the frequency compensation coefficient (Vcoef2), the frequency compensation coefficient (Vcoef2) generated in the digital pre-distorter controller 800 is applied as it is.

The signal (Vd) outputted from the correction filter 150 is outputted after passing through the power amplifier, a portion of which is fed back to the digital pre-distorter controller 800.

The digital pre-distorter controller 800 compares the feedback signal (Vfb) with the narrow-band frequency signal and reanalyzes output characteristics of the power amplifier. If a new power/phase compensation coefficient or a new temperature compensation coefficient is generated, the digital pre-distorter controller 800 stores the corresponding compensation coefficient (Vcoef1) in the look-up table 110, for updating (step S38). In addition, If a new frequency compensation coefficient (Vcoef2) is generated, the digital pre-distorter controller 800 applies the new frequency compensation coefficient to the signal applied to the correction filter 150.

If the narrow-band frequency signal is continuously inputted to the digital pre-distorter (step S39), the process of pre-compensating the narrow-band frequency signal and updating the compensation coefficient is continually performed. If, however, no narrow-band frequency signal is inputted, the process is terminated (S40).

As described, the apparatus and method for compensating pre-distortion of a power amplifier in accordance with the exemplary embodiment present invention has the following advantages. First, by compensating the memory effect because of the temperature change and the frequency characteristics change as well as the power/phase distortion characteristics of the power amplifier, degradation due to the nonlinear characteristics of the power amplification can be improved. Second, an industrial practicability can be expected that the power amplifier with a small capacity is operated with the maximum efficiency. Third, the temperature change of the power amplifier is sensed by using the average power of an input signal without using a temperature detector. Thus, its construction is simple, maintenance and repair is easy, and an additional cost for the temperature detector does not incur. Fourth, a reliability for a data transmission is enhanced because a signal is transmitted without distortion.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structure described herein as performing the recited function and not only structural equivalents but also equivalent structures.

What is claimed is:

1. An apparatus for reducing distortion of a power amplifier, comprising:
    a controller that compares a signal fed back from the power amplifier and an input signal and generates temperature and power/phase compensation coefficients and a frequency compensation coefficient based on the comparison; and
    a pre-distorter that adjusts the input signal based on the temperature and phase/power coefficients and the frequency compensation coefficient generated by the digital pre-distorter controller, wherein the pre-distorter comprises,
        a first look-up table that stores the temperature and power/phase compensation coefficients generated by the controller,
        a pre-distorter kernel that compensates the input signal based on the temperature compensation and power/phase coefficients stored in the first look-up table,
        a correction filter that compensates an output signal of the pre-distorter kernel based on the frequency compensation coefficient,
        an instantaneous power measuring unit that measures an instantaneous power of the input signal, and
        an average power measuring unit that measures an average power of an output signal of the instantaneous power measuring unit.

2. The apparatus of claim 1, wherein the first look-up table includes a plurality of aligned tables that discriminate a plurality of coefficients by average powers.

3. The apparatus of claim 2, wherein the first look-up table includes a plurality of blocks that store respective temperature and power/phase compensation coefficients which are discriminated based on instantaneous powers.

4. The apparatus of claim 1, wherein the input signal is a narrow-band frequency signal.

5. The apparatus of claim 1, further comprising:
    a second look-up table that stores the frequency compensation coefficients by average powers, if the input signal is a wide-band frequency.

6. The apparatus of claim 1, wherein the first look-up table includes a plurality of aligned tables which discriminate the temperature and power/phase compensation coefficients by average powers.

7. The apparatus of claim 6, wherein the first look-up table includes a plurality of blocks which store by instantaneous powers the temperature and power/phase compensation coefficients discriminated by average powers.

8. The apparatus of claim 1, wherein the controller and pre-distorter are digital devices.

9. An apparatus for reducing distortion of a power amplifier, comprising:
    a digital pre-distorter controller that compares a signal fed back from a power amplifier and an input signal and generates a power/phase compensation coefficient and at least one of a temperature compensation coefficient and a frequency compensation coefficient based on the comparison;

an instantaneous power measuring unit that measures an instantaneous power of the input signal;

an average power measuring unit that generates an average power from an output signal of the instantaneous power measuring unit;

a first look-up table that stores the power/phase compensation coefficient and the temperature compensation coefficient and outputs the compensation coefficients according to an instantaneous power and an average power of the input signal;

a pre-distorter kernel that compensates the input signal based on the power/phase compensation coefficient and the temperature compensation coefficient output from the look-up table; and a correction filter that compensates a frequency distortion characteristic of the power amplifier by adjusting an output signal of the pre-distorter kernel based on the frequency compensation coefficient.

10. The apparatus of claim 9, wherein the input signal is a narrow-band frequency signal.

11. The apparatus of claim 9, further comprising:

a second look-up table for storing a plurality of frequency compensation coefficients by average powers, if the input signal is a wide-band frequency signal.

12. The apparatus of claim 9, wherein the instantaneous power and the average power are used as a basis for determining positions where the power/phase compensation coefficient and the temperature compensation coefficient are stored.

13. A method for reducing distortion of a power amplifier, comprising:

generating/storing frequency compensation coefficients based on average power levels of a training signal;

generating/storing temperature and power/phase compensation coefficients based on instantaneous power and average power of a signal fed back from a power amplifier in a first look-up table compensated by applying the frequency compensation coefficient;

compensating an input signal by applying one of the temperature and power/phase compensation coefficients corresponding to an instantaneous power and an average power of the input signal using a pre-distorter kernel that compensates the input signal based on the power/phase compensation coefficient and the temperature compensation coefficient output from the first look-up table;

compensating the temperature and power/phase compensated signal using a corresponding one of the frequency compensation coefficients using a correction filter that compensates a frequency distortion characteristic of the power amplifier by adjusting an output signal of the pre-distorter kernel based on the frequency compensation coefficient; and re-generating a new frequency compensation coefficient and a new temperature and power/phase compensation coefficient based on additional signals fed back from the power amplifier.

14. The method of claim 13, wherein the re-generating step comprises:

comparing the pre-compensated signal and the input signal and generating new frequency, temperature and phase/power compensation coefficients based on the comparison; and storing the new compensation coefficients.

15. The method of claim 13, wherein the frequency compensation coefficients and the temperature and phase/power compensation coefficients are stored in a look-up table based on instantaneous power or average power levels of signal input to the power amplifier.

16. The method of claim 13, wherein the instantaneous power and the average power are used as addresses for storing the frequency compensation coefficients or the temperature and phase/power compensation coefficients.

17. An apparatus for reducing power amplifier distortion, comprising:

generating temperature, frequency and power/phase compensation coefficients based on an operation of an amplifier;

a processor which adjusts an input signal input to of the amplifier using the temperature, frequency and power/phase coefficients to reduce the power amplifier distortion caused by temperature, frequency and power/phase characteristics of the amplifier, wherein the processor includes, a comparator that compares the input signal to an output signal of the amplifier, a determining unit that determines the temperature and phase/power compensation coefficients based on the comparison, a first look-up table that stores the power/phase compensation coefficient and the temperature compensation coefficient and outputs the compensation coefficients according to an instantaneous power and an average power of the input signal, a pre-distorter kernel that adjusts the input signal based on the temperature and phase/power compensation coefficients output by the first look-up table to reduce a non-linear characteristic of the amplifier, and a correction filter that compensates a frequency distortion characteristic of the amplifier by adjusting an output signal of the pre-distorter kernel based on the frequency compensation coefficient.

18. The apparatus of claim 17, wherein the kernel modifies the input signal to have a temperature and phase/power distortion characteristic which is inverse to a temperature and phase/power distortion characteristic of the power amplifier.

19. The apparatus of claim 17, further comprising:

a storage unit which stores a plurality of temperature and phase/power compensation coefficients based on a corresponding plurality of amplifier power levels; and a measurement unit which determines a power of the amplifier, wherein the storage unit outputs the temperature and phase/power compensation coefficients used to adjust the input signal based on the amplifier power measurement.

* * * * *